(12) United States Patent
King et al.

(10) Patent No.: US 6,316,715 B1
(45) Date of Patent: Nov. 13, 2001

(54) MULTIJUNCTION PHOTOVOLTAIC CELL WITH THIN 1ST (TOP) SUBCELL AND THICK 2ND SUBCELL OF SAME OR SIMILAR SEMICONDUCTOR MATERIAL

(75) Inventors: Richard R. King, Newbury Park; David E. Joslin, Valley Village; Nasser H. Karam, Northridge, all of CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/544,834

(22) Filed: Mar. 15, 2000

(51) Int. Cl.$^7$ .............................. H01L 31/04; H01L 31/06
(52) U.S. Cl. ..................... 136/255; 136/249; 136/261; 136/262; 257/434; 257/438; 257/461; 257/464
(58) Field of Search .......................... 136/249 TJ, 255, 136/261, 262; 257/434, 438, 461, 464

(56) References Cited

U.S. PATENT DOCUMENTS

| | | |
|---|---|---|
| 4,017,332 | 4/1977 | James . |
| 4,127,862 * | 11/1978 | Ilegems et al. ................. 136/149 |
| 4,255,211 | 3/1981 | Fraas . |
| 4,332,974 | 6/1982 | Fraas . |
| 4,377,723 * | 3/1983 | Dalal ................................ 136/249 |
| 4,631,352 * | 12/1986 | Daud et al. ..................... 136/249 |
| 4,926,230 * | 5/1990 | Yamagishi et al. ............. 136/249 |
| 5,100,478 | 3/1992 | Kawabata . |
| 5,322,573 | 6/1994 | Jain et al. . |
| 5,407,491 | 4/1995 | Freundlich et al. . |
| 5,800,630 | 9/1998 | Vilela et al. . |

OTHER PUBLICATIONS

Marfaing, "Evaluation of Multijunction Structures Using Amorphous Si–Ge Alloys," 2nd E.C. Photvoltaic Solar Energy Conference, Apr. 23–26, 1979, pp. 287–294.*

Kurtz, et al., Modeling of two-junction, series-connected tandem solar cells using top-cell thickness as an adjustable parameter, J. Appl. Phys. 68 (4), Aug. 15, 1990, pp. 1890–1895, Colorado.

* cited by examiner

*Primary Examiner*—Alan Diamond
(74) *Attorney, Agent, or Firm*—DiPinto & Shimokaji, P.C.

(57) ABSTRACT

A multijunction photovoltaic cell comprises a first subcell that initially receives incident light upon the photovoltaic cell, with the first subcell being made of a first material system, having a first thickness, and producing a first photogenerated current output. A second subcell receives the incident light after the first subcell receives the incident light, with the second subcell being disposed immediately adjacent the first subcell. The second subcell is made of the first material system or a similar semiconductor material, has a second thickness that is greater than the first thickness, and produces a second photogenerated current output that is substantially equal in amount to the first photogenerated current output. A tunnel junction is disposed between the first and second subcells. The multijunction cell provides a greater ability to current match to low-current-producing subcells, higher multijunction cell voltage, lower series resistance, and greater radiation resistance.

23 Claims, 8 Drawing Sheets

| TUNNEL JUNCTION CONNECTING SUBCELLS IN SERIES | INCIDENT LIGHT | BANDGAP $E_g$ | THICK-NESS | MAXIMUM AVAILABLE $J_{ph}$ (ADJUSTABLE BY THICKNESS) | ESTIMATE OF SERIES-LIMITED $J_{sc}$ | OPTI-MISTIC $V_{oc}$ | IDEAL EFFICIENCY OF SERIES-INTERCONNECTED MULTIJUNCTION CELL |
|---|---|---|---|---|---|---|---|
| | | (eV) | (μM) | (mA/cm$^2$) | (mA/cm$^2$) | (V) | (%) |
| Subcell 11 | Ga$_{0.5}$In$_{0.5}$P | ~1.90 | ~0.11 | ~12.44 | 10.45 | ~1.5 | 10.6 |
| Subcell 12 | Ga$_{0.5}$In$_{0.5}$P | ~1.80 | ~0.6 | ~12.44 | 10.45 | ~1.4 | 9.8 |
| Subcell 13 | GaAs (or GaInPAs) | 1.424 | ~0.5 to 400 (or higher) | ~13.08 | 10.45 | ~1.02 | 7.0 |
| | Output of multijunction cell: | | | | 10.45 | ~3.92 | 27.4 |

10

| | | BANDGAP Eg | THICK-NESS | MAXIMUM AVAILABLE Jph (ADJUSTABLE BY THICKNESS) | ESTIMATE OF SERIES-LIMITED Jsc | OPTI-MISTIC Voc | IDEAL EFFICIENCY OF SERIES-INTERCONNECTED MULTIJUNCTION CELL |
|---|---|---|---|---|---|---|---|
| | INCIDENT LIGHT → | (eV) | (μM) | (mA/cm$^2$) | (mA/cm$^2$) | (V) | (%) |
| Subcell 11 | $Ga_{0.5}In_{0.5}P$ | ~1.90 | ~0.11 | ~12.44 | 10.45 | ~1.5 | 10.6 |
| Subcell 12 | $Ga_{0.5}In_{0.5}P$ | ~1.80 | ~0.6 | ~12.44 | 10.45 | ~1.4 | 9.8 |
| | | | | Output of multijunction cell: | 10.45 | ~2.9 | 20.4 |

TUNNEL JUNCTION CONNECTING SUBCELLS IN SERIES — 16

FIG. 1

| | INCIDENT LIGHT | BANDGAP Eg (eV) | THICK-NESS (μM) | MAXIMUM AVAILABLE Jph (ADJUSTABLE BY THICKNESS) (mA/cm$^2$) | ESTIMATE OF SERIES-LIMITED Jsc (mA/cm$^2$) | OPTI-MISTIC Voc (V) | IDEAL EFFICIENCY OF SERIES-INTERCONNECTED MULTIJUNCTION CELL (%) |
|---|---|---|---|---|---|---|---|
| Subcell 11 | $Ga_{0.5}In_{0.5}P$ | ~1.90 | ~0.11 | ~12.44 | 10.45 | ~1.5 | 10.6 |
| Subcell 12 | $Ga_{0.5}In_{0.5}P$ | ~1.80 | ~0.6 | ~12.44 | 10.45 | ~1.4 | 9.8 |
| Subcell 13 | GaAs (or GaInPAs) | 1.424 (or higher) | ~0.5 to 400 | ~13.08 | 10.45 | ~1.02 | 7.0 |
| | | | | Output of multijunction cell: | 10.45 | ~3.92 | 27.4 |

FIG. 2

| | INCIDENT LIGHT | BANDGAP $E_g$ (eV) | THICK-NESS ($\mu M$) | MAXIMUM AVAILABLE $J_{ph}$ (ADJUSTABLE BY THICKNESS) (mA/cm$^2$) | ESTIMATE OF SERIES-LIMITED $J_{sc}$ (mA/cm$^2$) | OPTI-MISTIC $V_{oc}$ (V) | IDEAL EFFICIENCY OF SERIES-INTERCONNECTED MULTIJUNCTION CELL (%) |
|---|---|---|---|---|---|---|---|
| Subcell 11 | Ga$_{0.5}$In$_{0.5}$P | ~1.90 | ~0.11 | ~12.44 | 10.45 | ~1.5 | 10.6 |
| Subcell 12 | Ga$_{0.5}$In$_{0.5}$P | ~1.80 | ~0.6 | ~12.44 | 10.45 | ~1.4 | 9.8 |
| Subcell 13 | GaAs (or GaInPAs) | 1.424 (or higher) | ~0.5 to 6.0 | ~13.08 | 10.45 | ~1.02 | 7.0 |
| Subcell 14 | Ge | 0.66 | ~1.0 TO 400 | ~39.59 | 10.45 | ~0.26 | 1.4 |
| | Output of multijunction cell: | | | | 10.45 | ~4.18 | 28.8 |

TUNNEL JUNCTION CONNECTING SUBCELLS IN SERIES

| | INCIDENT LIGHT → | BANDGAP Eg (eV) | THICK-NESS (μM) | MAXIMUM AVAILABLE Jph (ADJUSTABLE BY THICKNESS) (mA/cm$^2$) | ESTIMATE OF SERIES-LIMITED Jsc (mA/cm$^2$) | OPTI-MISTIC Voc (V) | IDEAL EFFICIENCY OF SERIES-INTERCONNECTED MULTIJUNCTION CELL (%) |
|---|---|---|---|---|---|---|---|
| Subcell 11 | $Ga_{0.5}In_{0.5}P$ | ~1.90 | ~0.11 | ~11.48 | 9.65 | ~1.5 | 9.8 |
| Subcell 12 | $Ga_{0.5}In_{0.5}P$ | ~1.80 | ~0.6 | ~11.48 | 9.65 | ~1.4 | 9.1 |
| Subcell 13 | GaAs (or GaInPAs) | 1.424 (or higher) | ~0.8 | ~11.48 | 9.65 | ~1.02 | 6.5 |
| Subcell 14 | GaInNAs (or other 0.9–1.2 eV semicond) | ~1.15 | ~0.1 to 6.0 | ~16.08 | 9.65 | ~0.75 | 4.6 |
| Subcell 15 | Ge | 0.66 | ~1.0 TO 400 | ~27.01 | 9.65 | ~0.26 | 1.3 |
| | | | | Output of multijunction cell: | 9.65 | ~4.93 | 31.2 |

TUNNEL JUNCTION CONNECTING SUBCELLS IN SERIES — 16

| | INCIDENT LIGHT → | BANDGAP Eg (eV) | THICK-NESS (μM) | MAXIMUM AVAILABLE Jph (ADJUSTABLE BY THICKNESS) (mA/cm²) | ESTIMATE OF SERIES-LIMITED Jsc (mA/cm²) | OPTI-MISTIC Voc (V) | IDEAL EFFICIENCY OF SERIES-INTERCONNECTED MULTIJUNCTION CELL (%) |
|---|---|---|---|---|---|---|---|
| Subcell 11 | AlGaInP | ~2.00 | ~0.14 | ~11.48 | 9.65 | ~1.6 | 10.5 |
| Subcell 12 | Ga$_{0.5}$In$_{0.5}$P | ~1.80 | ~0.6 | ~11.48 | 9.65 | ~1.4 | 9.1 |
| Subcell 13 | GaAs (or GaInPAs) | 1.424 (or higher) | ~0.8 | ~11.48 | 9.65 | ~1.02 | 6.5 |
| Subcell 14 | GaInNAs (or other 0.9–1.2 eV semicond) | ~1.15 | ~0.1 to 6.0 | ~16.08 | 9.65 | ~0.75 | 4.6 |
| Subcell 15 | Ge | 0.66 | ~1.0 to 400 | ~27.01 | 9.65 | ~0.26 | 1.3 |
| | | | | Output of multijunction cell: | 9.65 | ~5.03 | 31.9 |

FIG. 6

| | BANDGAP $E_g$ | THICK-NESS | MAXIMUM AVAILABLE $J_{ph}$ (ADJUSTABLE BY THICKNESS) | ESTIMATE OF SERIES-LIMITED $J_{sc}$ | OPTI-MISTIC $V_{oc}$ | IDEAL EFFICIENCY OF SERIES-INTERCONNECTED MULTIJUNCTION CELL |
|---|---|---|---|---|---|---|
| | (eV) | (μM) | (mA/cm$^2$) | (mA/cm$^2$) | (V) | (%) |
| Subcell 11  Ga$_{0.5}$In$_{0.5}$P | ~1.90 | ~0.11 | ~12.44 | 10.45 | ~1.5 | 10.6 |
| Subcell 12  Ga$_{0.5}$In$_{0.5}$P | ~1.80 | ~0.6 | ~12.44 | 10.45 | ~1.4 | 9.8 |
| Subcell 13  Ge | 0.66 | ~1.0 to 400 | ~52.67 | 10.45 | ~0.26 | 1.4 |
| Output of multijunction cell: | | | | 10.45 | ~3.16 | 21.8 |

TUNNEL JUNCTION CONNECTING SUBCELLS IN SERIES

INCIDENT LIGHT →

MULTIJUNCTION PHOTOVOLTAIC CELL WITH THIN 1ST (TOP) SUBCELL AND THICK 2ND SUBCELL OF SAME OR SIMILAR SEMICONDUCTOR MATERIAL

BACKGROUND OF THE INVENTION

1. Field of the Invention

The present invention generally relates to photovoltaic cells and, more particularly, to an improved multijunction photovoltaic cell having a thin top subcell and a thick lower subcell whose energy bandgaps are the same or close to one another which results in improved current matching, adaptability, radiation resistance, and higher voltages.

2. Description of Related Art

The interest in photovoltaic (PV) cells continues as concerns over pollution and limited resources continue. The continued interest has been in both terrestrial and non-terrestrial applications. In the non-terrestrial environment of outer space, the concern over limited resources of any type is a major one. This is because the need to increase the amount of a resource increases the payload. An increased payload can increase the cost of a launch more than linearly. With the ready availability of solar energy in outer space for a spacecraft such as a satellite, the conversion of solar energy into electrical energy is an obvious alternative to increased payload.

The cost per watt of electrical power generation capacity of photovoltaic systems is the main factor which inhibits their widespread use in terrestrial applications. Conversion efficiency of sunlight to electricity is of critical importance for terrestrial photovoltaic systems, since increased efficiency means that all area-related components of the electricity generation system, i.e., cell area, module or collector area, support structures, land area, etc., can be reduced when the efficiency is increased, for a given required power output of the system. For example, in concentrator photovoltaic systems which concentrate the sunlight, typically from 2 to 2000 times, onto the photovoltaic cell, an increase in efficiency means that the area of the expensive concentrating optics can be reduced proportionally. Concentrator photovoltaic systems are a likely application of the multijunction cells described in this invention, because the cell area can be reduced by the concentration ratio, allowing the use of relatively complicated solar cells with a high cost per unit area.

Irrespective of the application, and as with any energy generation system, efforts have been ongoing to increase the output and/or efficiency of PV cells. In terms of output, multiple cells or layers having different energy bandgaps have been stacked so that each cell or layer can absorb a different part of the wide energy distribution of photons in sunlight. The stacked arrangement has been provided in a monolithic structure on a single substrate or on multiple substrates. Examples of multi-cell devices are shown in Kurtz et al., "Modeling of two-junction, series-connected tandem solar cells using top-cell thickness as an adjustable parameter," J. Appl. Phys. 68(4), pp. 1890–1895, Aug. 15, 1990; and U.S. Pat. Nos. 5,800,630; 5,407,491; 5,100,478; 4,332,974; 4,225,211; and 4,017,332.

In the multiple cell device, semiconductive materials are typically lattice-matched to form multiple p-n (or n-p) junctions. The p-n (or n-p) junctions can be of the homo-junction or heterojunction type. When solar energy is received at a junction, minority carriers (i.e., electrons and holes) are generated in the conduction and valence bands of the semiconductor materials adjacent the junction. A voltage is thereby created across the junction and a current can be utilized therefrom. As the solar energy passes to the next junction which has been optimized to a lower energy range, additional solar energy at this lower energy range can be converted into a useful current. With a greater number of junctions, there can be greater conversion efficiency and increased output voltage.

Whether in the multiple-junction or single-junction PV device, a conventional characteristic of PV cells has been the use of a single window layer on an emitter layer disposed on a base/substrate, which is shown for example in U.S. Pat. No. 5,322,573. Similarly, a single layer back-surface field structure below the base/substrate has been used, as shown in U.S. Pat. No. 5,800,630. The purpose of the back-surface field structure has been to serve as a passivation layer, like the single window layer described above.

For the multiple-cell PV device, efficiency is limited by the requirement of low resistance interfaces between the individual cells to enable the generated current to flow from one cell to the next. Accordingly, in a monolithic structure, tunnel junctions have been used to minimize the blockage of current flow. In a multiple wafer structure, front and back metallization grids with low coverage fraction and transparent conductors have been used for low resistance connectivity.

Another limitation to the multiple cell PV device is that current output at each junction must be the same for optimum efficiency in the series-connected configuration. Also, there is a practical limit on the number of junctions, since each successive junction generates a smaller current.

The performance limitations above can be found, for example, in PV devices that include GaInP/GaAs, GaInP/GaAs/Ge, GaInP/GaAs/GaInNAs/Ge, and GaInP/Ge. The above structures have relatively high current densities, which can pose problems for current matching subcells that are poor current producers. The structures also have comparatively low voltages, resulting in greater power loss due to series resistance. Subcell base thicknesses can be large, and some subcells have little excess photogenerated current density, both of which impair radiation resistance.

To increase efficiency in a two junction cell, Kurtz et al., supra, have reduced the thickness of the top cell. According to Kurtz et al., the primary increase in efficiency results from an increase in current as the top cell thickness is optimized. The materials systems mentioned are $Ga_{0.5}In_{0.5}P/GaAs$, $InP/Ga_{0.5}In_{0.5}As$, and GaAs/Ge dual-junction cells. Contour plots are shown for a range of bottom cell bandgaps from ~0.6 to 1.5 eV, combined with top cell bandgaps from ~1.35 to 2.1 eV, with emphasis on the ranges of 1.1 to 1.5 eV for the bottom cell combined with a 1.7 to 2.1 eV top cell. Dual-junction cells with the same bandgap or the same semiconductor material for the top and bottom cells are not mentioned in the text of the article. The emphasis of the paper is on $GaAs/Ga_{0.5}In_{0.5}P$ cells.

What does not appear to be taught by Kurtz et al., among other things, are multijunction cells having more than two junctions, and multijunction cells in which a single subcell has been replaced by two subcells of the same semiconductor material interconnected by a tunnel junction, such as $Ga_{0.5}In_{0.5}P/Ga_{0.5}In_{0.5}P$ and $Ga_{0.5}In_{0.5}P/Ga_{0.5}In_{0.5}P/GaAs$ multijunction cells. Also omitted is an apparent discussion of how replacing a single subcell with two subcells of the same semiconductor material can: 1) make it possible to current match to $3^{rd}$, $4^{th}$, . . . nth subcells in a series-interconnected multijunction cell, by replacing the current density of the multijunction cell at its maximum power point; 2) essentially double the voltage contribution of the subcell that was replaced by two subcells of the same semiconductor material, thereby reducing series resistance losses and reducing the number of cells that must be interconnected in array strings to reach a given array voltage; 3) increase resistance to radiation damage that is encountered by photovoltaic cells, due to the reduced subcell base thickness that can result when replacing a single subcell by two subcells of the same semiconductor material, as well as to the opportunity for giving greater excess photogenerated current density to other subcells in the multijunction stack because of the reduced current density of the multijunction cell, and 4) increase multijunction cell efficiency.

As can be seen, there is a need for an improved multijunction photovoltaic cell that has increased efficiency and higher radiation resistance. Also needed is a multijunction photovoltaic cell that provides higher voltage, thus reducing series resistance in the cell. Another need is for a photovoltaic cell that has current matched subcell, even when a subcell is of poor material quality, is thinner that optimal, and has a wider bandgap than optimal.

SUMMARY OF THE INVENTION

The present invention is directed to an improved multijunction photovoltaic cell, comprising a first subcell that initially receives incident light upon the photovoltaic cell, with the first subcell being made of a first material system, having a first thickness, and producing a first photogenerated current output. A second subcell receives the incident light after the first subcell receives the incident light, with the second subcell being disposed immediately adjacent the first subcell. The second subcell is made of said first material system, has a second thickness that is greater than the first thickness, and produces a second photogenerated current output that is substantially equal in amount to the first photogenerated current output. A tunnel junction is disposed between the first and second subcells.

In another aspect of the present invention, a multijunction photovoltaic cell comprises a top subcell made of a first material system, having a first thickness, having a first energy bandgap, and producing a first photogenerated current density. A second subcell is disposed immediately adjacent to the top subcell, with the second subcell being made of a second material system, having a second thickness, and producing a second photogenerated current density that is substantially equal in amount to the first photogenerated current density. The second subcell has a second energy bandgap that is less than the first energy bandgap such that the ratio of photon flux in the light incident on the photovoltaic cell with photon energy greater than the first energy bandgap, to the photon flux in the incident light with photon energy between the first and second energy bandgaps, is at least two. A plurality of lower subcells are adjacent the second subcell, with the lower subcells made of a plurality of lower material systems that are different from the first and second material systems, each successively lower one of the lower subcells having an energy bandgap lower than the one immediately above it, and each successively lower one of the lower subcells having a photogenerated current density at least equal to the one immediately above it. A plurality of tunnel junctions is disposed between the subcells.

In yet a further aspect of the present invention, a multijunction photovoltaic cell comprises a top subcell made of a first material system, having a first thickness, having a first energy bandgap, and producing a first photogenerated current density. A second subcell is disposed immediately adjacent to the top subcell, with the second subcell being made of a second material system, having a second thickness, producing a second photogenerated current density that is substantially equal in amount to the first photogenerated current density, and having a second energy bandgap that is less than the first energy bandgap such that a ratio of photon flux in incident light to the cell with photon energy greater than the first energy bandgap to photon flux in the incident light with photon energy between the first and second energy bandgaps is at least two. A plurality of lower subcells are adjacent the second subcell, with a first lower subcell made of a first lower material system that is the same as one of the second material system and a second lower material system of a second lower subcell that is immediately adjacent the first lower subcell. Each successively lower one of the lower subcells have an energy bandgap lower than the one immediately above it, and each successively lower one of the lower subcells have a photogenerated current density at least equal to the one immediately above it. A plurality of tunnel junctions is disposed between the subcells.

These and other features, aspects and advantages of the present invention will become better understood with reference to the following drawings, description, and claims.

DESCRIPTION OF THE PREFERRED EMBODIMENTS

The improved monolithic multijunction photovoltaic cell of the present invention is described below in various embodiments. In general, however, the photovoltaic cell of the present invention includes at least a first or top subcell that first receives incident light, a second subcell below the first subcell that subsequently receives the incident light, and a tunnel junction between the first and second subcells. The top subcell can be made of a material that is the same or similar to the second subcell. Also, the top subcell has a thickness less than that of the second subcell, has a same or similar bandgap compared to the second subcell, and produces a photogenerated current output substantially equal to the second subcell. In other embodiments, the present invention further includes a bottom subcell, as well as intermediate subcells that are disposed between the bottom subcell and the second subcell. In such instance, tunnel junctions are placed between the bottom and intermediate subcells.

The present invention provides a multijunction cell that has higher voltage and lower current when compared to a single, thick subcell used in the past. Additionally, higher voltage and lower current has the advantage of lower series resistance losses in the top conductive layer, contact metalization, and cell interconnects. Another advantage is current matching in some multijunction cell configurations described below.

Furthermore, while the present invention may be particularly useful in the context of spacecraft, such as in a solar panel of a satellite, other applications—both terrestrial and non-terrestrial—are contemplated. Still further, even though the present invention is described in the context of a photovoltaic cell, the invention is not so limited. Other contexts, such as sensors and other optoelectric devices, are contemplated to be within the scope of the present invention.

Given the breadth of the present invention, it can be appreciated by those skilled in the art that the different semiconductor layers that form the photovoltaic cell of the present invention can be made by many well-known processes in the art, such as molecular beam epitaxy (MBE), liquid phase epitaxy (LPE), metal-organic chemical vapor deposition (MOCVD), and conventional wafer bonding. In accordance with such known methods, the specific materials comprising the semiconductor layers may be altered and optimized to meet the requirements of the particular context.

Figure 1:
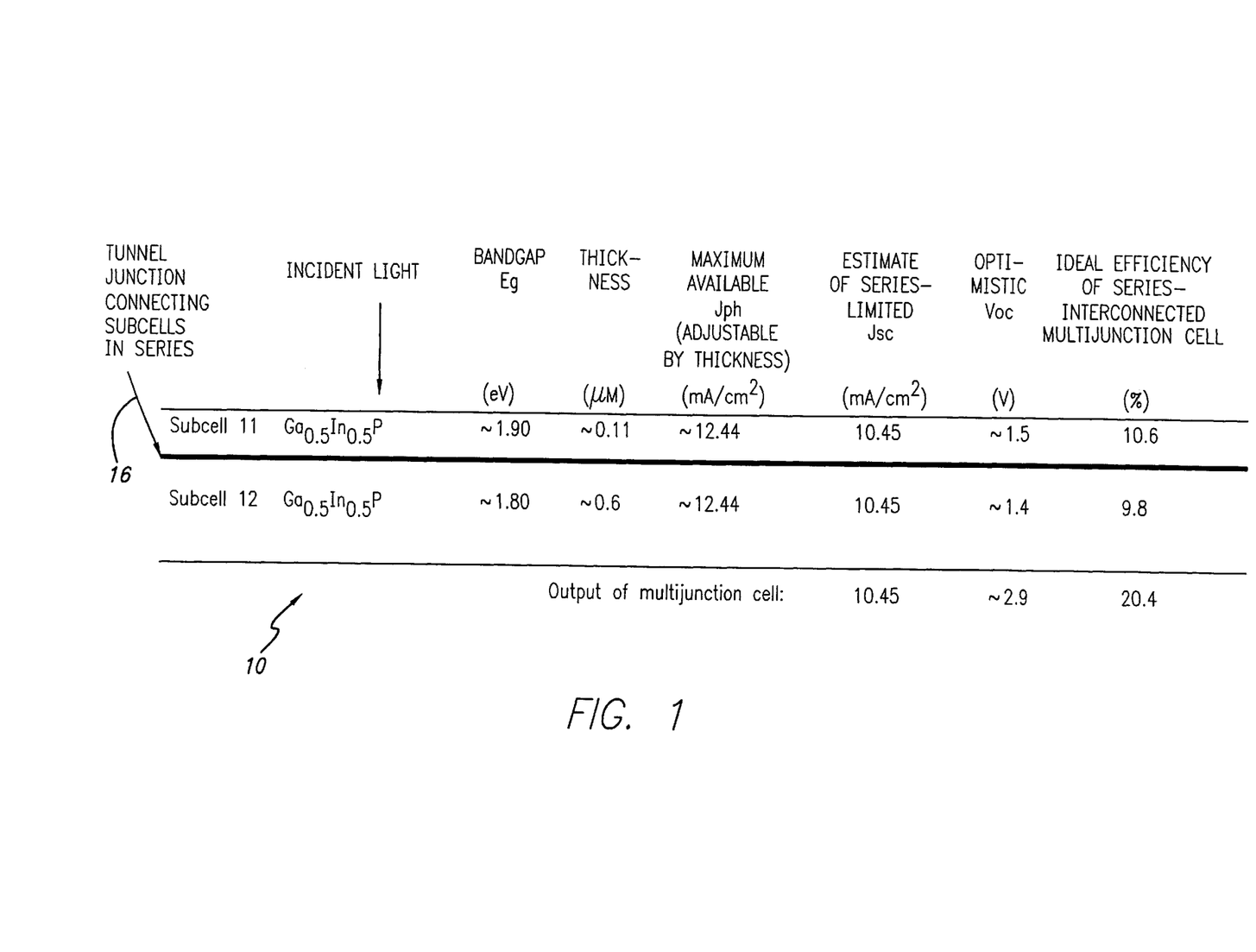
FIG. 1 is a schematic diagram of a first embodiment of the present invention.

A first embodiment of a photovoltaic cell 10 according to the present invention is schematically depicted in FIG.1. The cell 10 can receive incident light that passes through an antireflection layer or coating (not shown) that is disposed on top of the cell 10, as viewed from FIG. 1. The antireflection layer is intended to minimize surface reflections between the optically transparent media above the cell (such as air, glass, or polymer) and the semiconductor layers of the cell 10, thereby enabling more photons to enter the cell 10. The antireflection layer can be made from well-known materials in the art, such as $TiO_2$, $Ta_2O_5$, $SiO_2$, and $MgF_2$. The thickness of the antireflective coating can vary, but is typically between about 0.04 and 0.35 microns.

The photovoltaic cell 10 includes a first or top subcell 11, a second subcell 12 and a tunnel junction 16 therebetween. While not shown in the drawings, each subcell 11, 12 comprise a base and an emitter, as they are well known in the art and shown, for example, in U.S. Pat. No. 5,800,630 which is incorporated herein by reference. Optionally, each subcell 11, 12 include a window layer and/or back surface field layer, as are also known in the art and shown, for example, in U.S. Pat. No. 5,407,491 which is incorporated herein by reference. The below described thicknesses and compositions for the subcells 11, 12 refer to the main absorbing layers in each subcell 11, 12—namely, to the base and emitter layers for a homojunction subcell or to the base only for a heterojunction emitter subcell.

In the first embodiment depicted in FIG. 1, and for purposes of illustration, the first subcell 11 has a first thickness that is relatively thin (~0.11 µm), a first bandgap that is relatively wide (>about 1.90 eV), and made of a first material system of $Ga_{0.5}In_{0.5}P$. The second subcell 12 has a second thickness that is relatively thick (~0.6 µm), a second bandgap that is relatively low (<about 1.80 eV), and made of a second material system of $Ga_{0.5}In_{0.5}P$. Thereby, the first and second material systems are the same, even though the present invention contemplates that the material systems can be different. Both subcells 11, 12 also have substantially the same lattice constants. The bandgap difference between the subcells 11, 12 is such that a ratio of photon flux in incident light to the multijunction cell 10 with photon energy greater than the first energy bandgap to photon flux in the incident light with photon energy between the first and second energy bandgaps is at least two. The small difference in bandgaps is due to differing degrees of group III sublattice disorder. Specifically, the group III sublattice disorder in the first subcell 11 increases the first bandgap, while the group III sublattice ordering in the second subcell 12 decreases the second bandgap. The first subcell thickness is adjusted to match the currents of both subcells 11, 12. The slight difference in the bandgaps is far too small to allow current matching if both subcells 11, 12 were optically thick. But it allows the reduced thickness of the first or top subcell 11 that does result in current matching to be greater than it would be if the bandgaps were exactly the same.

Based on modeling calculations, the photogenerated current density $J_{ph}$ of each subcell 11, 12 can be as high as about 12 mA/cm² or even higher. The modeling calculations are based on the variation of the voltage and the portion of the AM0 solar spectrum that contributes to photogeneration of electron-hole pairs for each subcell, as functions of the bandgap of the base material of each subcell. Additionally, the modeling calculations are based on an ideal fill factor for each subcell with unity diode ideality factor, no series resistance loses, zero optical loss at the top of each subcell due to reflectance or parasitic absorption in the tunnel junctions, unity current collection efficiency for all photo-generated carriers in each subcell, and optically thin subcells where necessary for current matching. These ideal conditions are used in the cell modeling in order to compare the upper limit of performance for various multijunction cell structures. Accordingly, the combined voltage of the two subcells 11, 12 in series could reach about 2.9V, as shown in FIG. 1. A wide bandgap tunnel junction 16 (such as p-AlGaAs/n-GaInP or p-AlGaAs/n-AlGaAs) would be used between the subcells 11, 12 to allow as much incident light as possible to reach subcell 12. The tunnel junction 16 is constructed according to well known designs, such as that shown in U.S. Pat. No. 5,407,491.

In a specific example of the first embodiment, a p-AlGaAs:C/n-GaInP:Te tunnel junction 16 wherein the AlGaAs has ~60% Al mole fraction is especially advantageous. Use of this type of tunnel junction 16 results in a high bandgap of ~1.90 eV for the first subcell 11, indicating a first subcell 11 with a disordered group III sublattice, thus making it easier to current match the subcells 11, 12. The same type of tunnel junction 16, but with an Al mole fraction of ~35%, results in a lower bandgap, closer to 1.80 eV, for a subcell. Thus, such a tunnel junction 16 would be useful to employ in photovoltaic cells 10 having two or more subcells, whereby the bandgap of the second subcell 12 is lowered to make it easier for current matching between the subcells 11, 12.

In one variation of the first embodiment, a heterojunction emitter in the first subcell 11 can make it easier to current match the subcells 11, 12 as a result of such emitter minimizing light absorption in the first subcell 11 and increasing the blue response of the subcell 11. Examples of a heterojunction first subcell 11 include an n-AlInP emitter/p-GaInP base structure, an n-AlGaInP emitter/p-GaInP base structure, and an n-AlGaAs emitter/p-GaInP base structure. The heterojunction top subcell 11 structure can be used not only in the first embodiment, but also the other embodiments described below.

Figure 2:
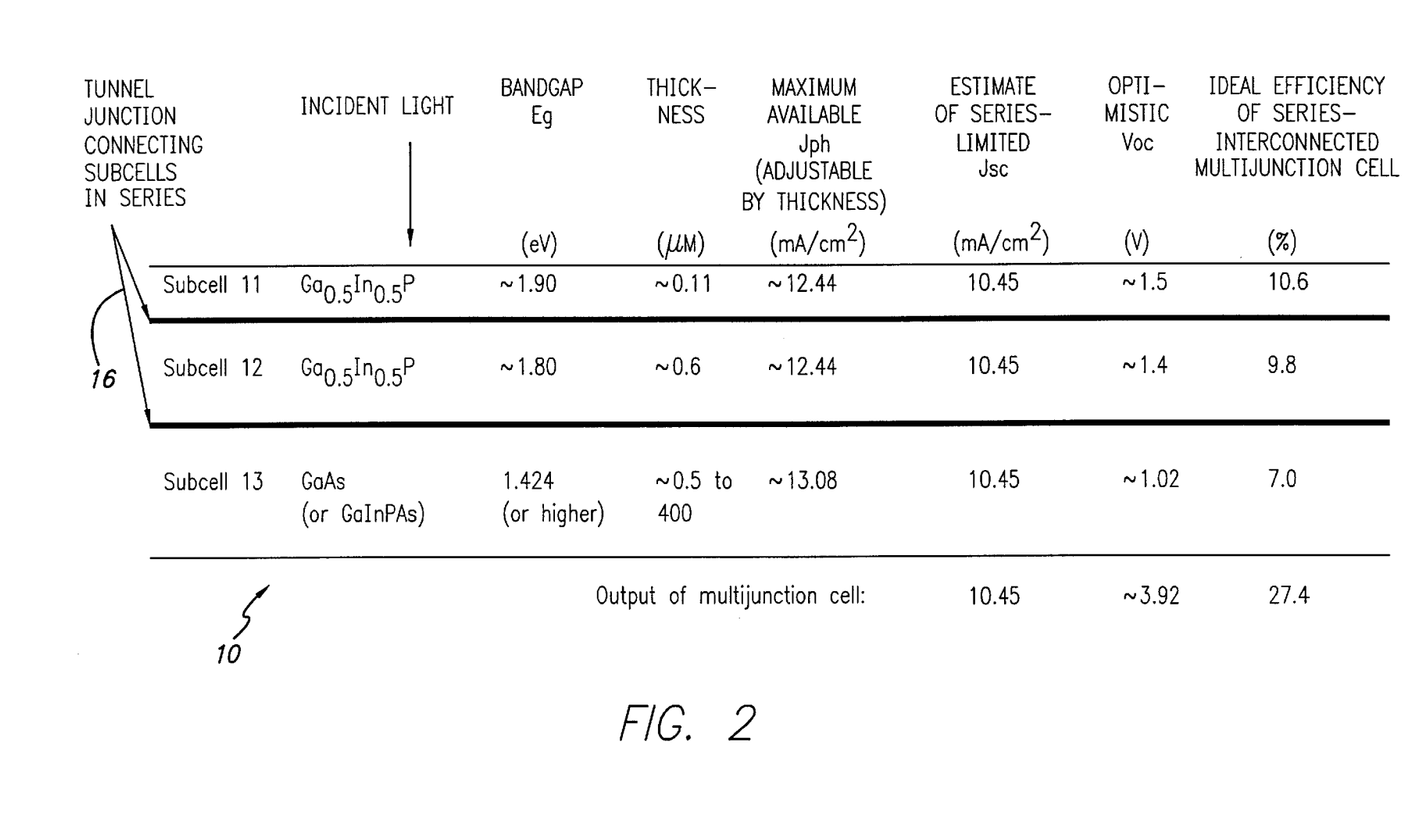
FIG. 2 is a schematic diagram of a second embodiment of the present invention.

A second embodiment of the present invention is shown in FIG. 2. This embodiment includes, for purposes of example, the embodiment of FIG. 1, but with the addition of a third or bottom subcell 13. The third subcell 13 is shown with a third material system of GaAs. The thicknesses of the subcells 11, 12, 13 are such that subcells 11, 12 have the same photogenerated current density $J_{ph}$ (i.e., current matched condition), or substantially the same $J_{ph}$. The third subcell 13 has as high or higher $J_{ph}$ than the first and second subcells 11, 12 as a result of its thickness and the difference between the third subcell 13 bandgap and that of the second subcell 12. A voltage of ~3.9 V is produced in this example, which is higher than the first embodiment described above.

An additional example of this second embodiment is a GaInP/GaInP/GaInAs 3-junction cell 10.

Figure 3:
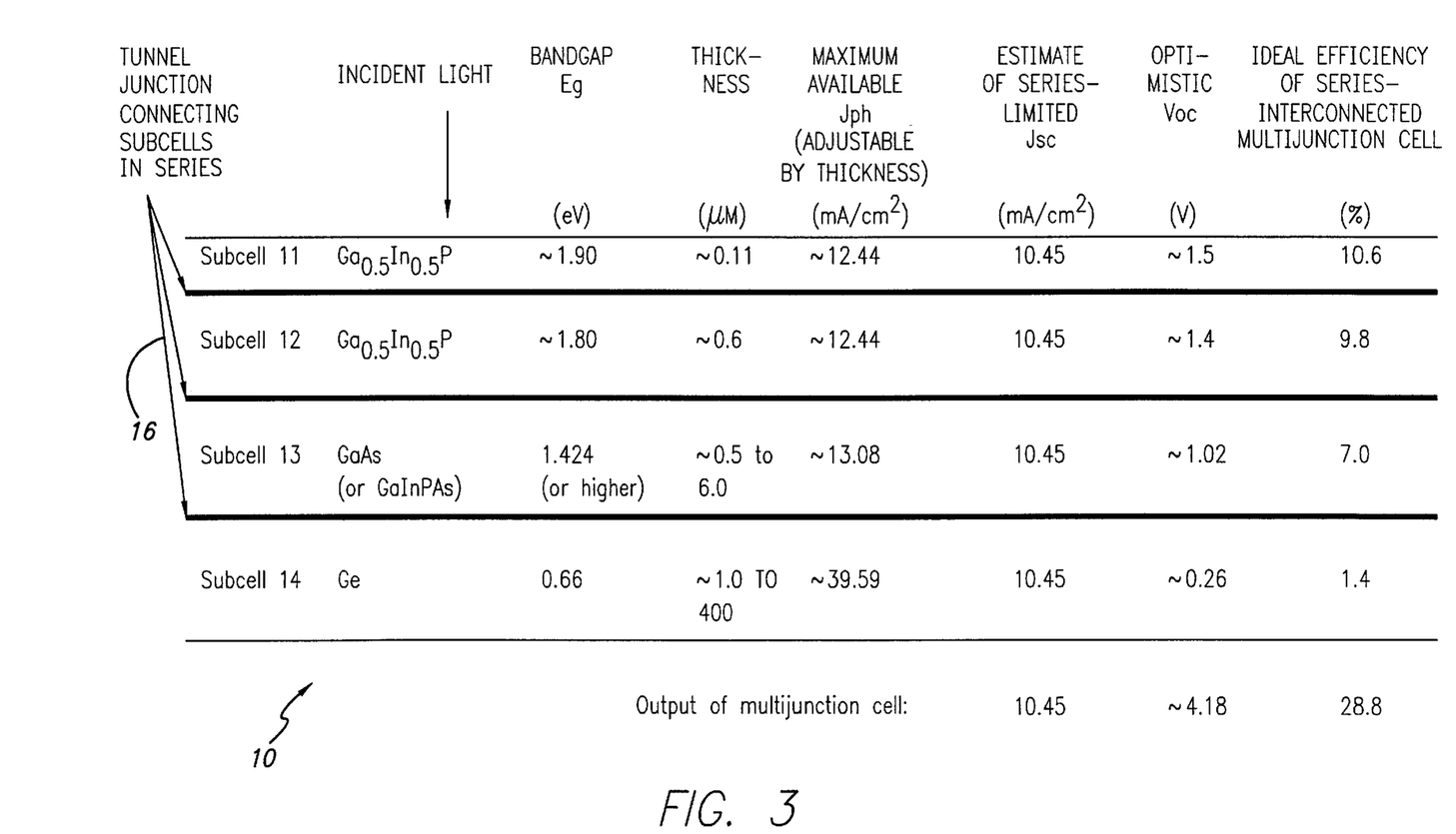
FIG. 3 is a schematic diagram of a third embodiment of the present invention.

A third embodiment of the present invention is shown in FIG. 3. This embodiment includes, for purposes of example, the embodiment of FIG. 2, but with the addition of a fourth or bottom subcell 14. Accordingly, the third subcell 13 may be referred to as a lower or intermediate subcell. The fourth subcell 14 is shown with a fourth material system of Ge. The thicknesses of the subcells 11–14 are such that subcells 11–13 have the same photogenerated current density $J_{ph}$ (i.e., current matched condition), or substantially the same $J_{ph}$. The fourth subcell 14 generates as much or more current than the first, second, and third subcells 11–13 as a result of its thickness and bandgap. A voltage of ~4.18 V is produced in this example, which is higher than the second embodiment described above. This 4-junction cell 10 shown in FIG. 3 would be expected to have a higher efficiency than the 3-junction cell 10 shown in FIG. 2 based on modeling calculations. The higher efficiency results from the additional voltage contributed by the fourth subcell 14. Additionally, the 4-junction cell 10 would be expected to have an efficiency within ~1% (absolute) of a conventional 3-junction GaInP/GaAs/Ge cell with a single GaInP subcell based on modeling calculations.

An additional example of this third embodiment is a GaInP/GaInP/GaInAs/Ge 4-junction cell 10.

Figure 4:
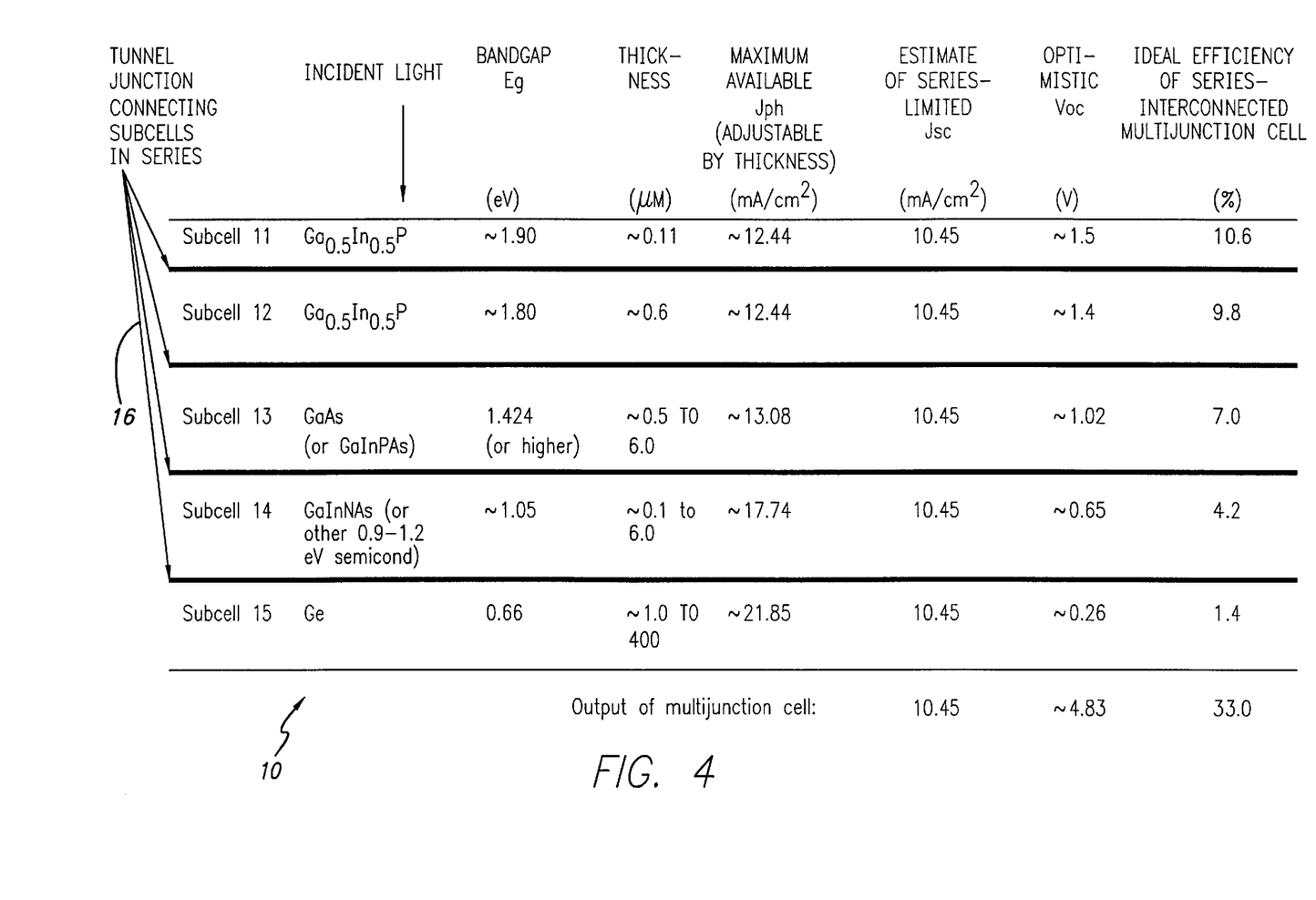
FIG. 4 is a schematic diagram of a fourth embodiment of the present invention.

In a fourth embodiment of the present invention shown in FIG. 4, the basic combination of a thin GaInP subcell 11 and thick GaInP subcell 12 (FIG. 1) can further be used as the top two subcells of a 5-junction monolithic, series-interconnected photovoltaic cell. In such embodiment, the third subcell 13 is made for example of GaAs, the fourth subcell 14 is made for example of a semiconductor with a bandgap between that of GaAs and Ge (e.g., ~0.9 to 1.2 eV, GaInNAs lattice-matched to GaAs), and a fifth or bottom subcell 15 made, for example, of Ge. In the example of FIG. 4, the bandgap of subcell 14 is 1.05 eV. The thicknesses of the subcells are such that the first through fourth subcells 11–14 have the same photogenerated current density $J_{ph}$ (i.e., current matched condition), or substantially the same $J_{ph}$. The fifth subcell 15 generates as much or more current that the first, second, third and fourth subcells 11–14.

The 5-junction cell 10 would be expected to have an open-circuit voltage of ~4.8 V and to have a higher efficiency than the 4-junction cell in FIG. 3, a conventional GaInP/GaAs/Ge 3-junction cell, or a conventional GaInP/GaAs/GaInNAs/Ge 4-junction cell. The advantage over the 4-junction cell 10 in FIG. 3 is largely due to the fourth subcell 14 in the 5-junction cell 10 providing a higher voltage than the fourth subcell 14 in the 4-junction cell 10. The advantage over the conventional GaInP/GaAs/GaInNAs/Ge 4-junction cell is largely due to the poor material quality and corresponding poor current production of the GaInNAs subcell. A variation of the 5-junction cell 10 shown in FIG. 4 would be a 4-junction GaInP/GaInP/GaAs/GaInNAs having a structure similar to the 5-junction cell but without a fifth subcell 15 (i.e., an inactive Ge or GaAs substrate in lieu of the fifth subcell 15).

As mentioned above, an important advantage of the 5-junction cell 10 shown in FIG. 4 is that, due to its low current and high voltage, the cell 10 can accommodate low current densities that are typically collected from the ~0.9 to 1.2 eV fourth subcell 14. For instance, GaInNAs solar cells lattice-matched to GaAs usually have collected current densities that are far below the photogenerated current density due to high electron-hole recombination. In the 5-junction cell 10, the current in each subcell 11–15 required for current matching is much lower than for a multijunction cell with a single GaInP subcell. Based on the modeling calculations, and in the case for which the subcell 14 has a 1.05 eV bandgap in a 5-junction cell 10, only about 60% of the maximum theoretical $J_{ph}$ of subcell 14 (under an optically thin GaAs subcell 13) is assumed to be collected. In spite of this, the approximate calculated efficiency is about 33%, which is higher than either the GaInP/GaAs/GaInNAs/Ge 4-junction cell 10 (~30.5% modeled efficiency) or the GaInP/GaAs/Ge conventional 3-junction cell (~28.9% modeled efficiency). Note that the GaInP/GaAs/GaInNAs/Ge 4-junction cell 10 assumes an optically thin GaAs subcell to allow enough incident light to reach the GaInNAs subcell for current matching. Note also that these modeled efficiencies are approximate. However, the set of assumptions used for the modeling calculations is consistent from case-to-case, allowing a valid comparison to be made between the various multijunction cell structures.

In order to achieve even about 60% of the maximum $J_{ph}$, GaInNAs subcells (and perhaps other ~0.9 to 1.2 eV cells) must often rely on field-aided collection of carriers, rather than on carrier diffusion. In such subcells, almost all collection comes from the space-charge region (SCR) associated with the p-n junction. The base is lightly doped or compensated to make the SCR wider in order to collect more carriers within the SCR. But problems with doping control, as well as voltage drops and recombination in the SCR, make it advantageous to have a thinner SCR if possible. The low current requirements of the 5-junction cell 10 with a thin GaInP subcell 11/thick GaInP subcell 12 make it possible to achieve current matching with an SCR in the ~0.9 to 1.2 eV fourth subcell 14 of reasonable thickness and without excessive losses in voltage.

Similarly, the low current requirements of the 5-junction cell 10 with a thin GaInP subcell 11/thick GaInP subcell 12 may make it possible to use semiconductors with bandgaps that are slightly wider than would otherwise be possible in the 0.9 to 1.2 eV fourth subcell 14. Increasing the bandgap of these materials may reduce the incidence of defects and, thus, result in greater carrier collection efficiencies. For instance, GaInNAs lattice-matched to GaAs has a lower nitrogen concentration at 1.15 eV than for 1.05 eV. If high nitrogen concentrations increase the density of the defects, then it may be easier to achieve current matching and higher efficiency if a 1.15 eV subcell with good carrier collection can be used. An example of such a 5-junction cell 10 is shown in FIG. 5.

Figure 5:
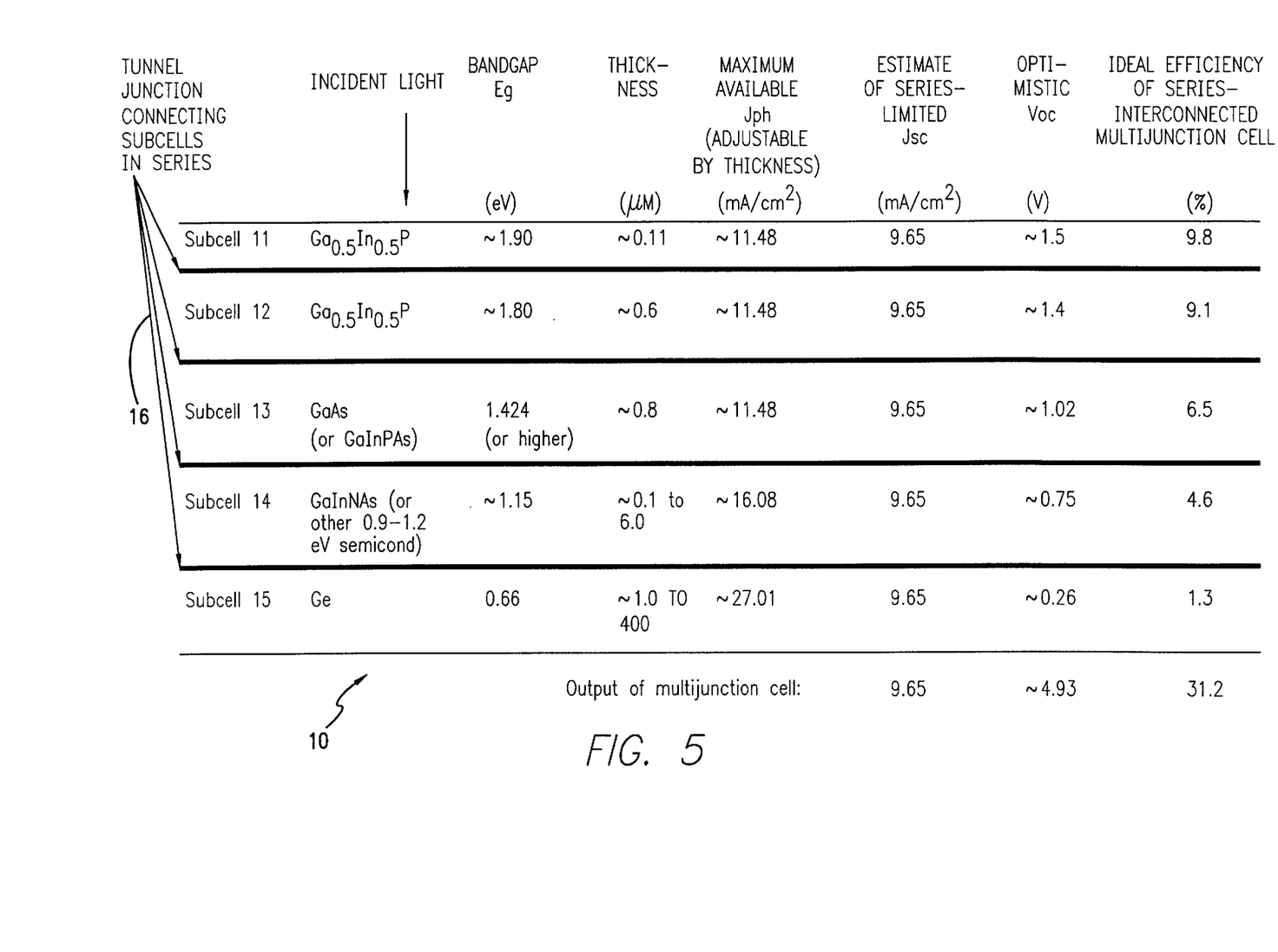
FIG. 5 is a schematic diagram of a fifth embodiment of the present invention.

In the fifth embodiment of the present invention depicted in FIG. 5, a thin first subcell 11, a thicker second subcell 12 with the same composition of $Ga_{0.5}In_{0.5}P$, a GaAs third subcell 13, a ~0.9 to 1.2 eV fourth subcell 14 (e.g., GaInNAs), and a Ge fifth subcell 15 are provided. For this example, a 1.15 eV bandgap is used for the fourth subcell 14.

If, in the fifth embodiment, Al is added to the composition of the first subcell 11 to produce AlGaInP, the bandgap of subcell 11 can be increased, thus relaxing somewhat the need to make the subcell 11 very thin to allow current matching. This is shown in FIG. 6.

Figure 6:
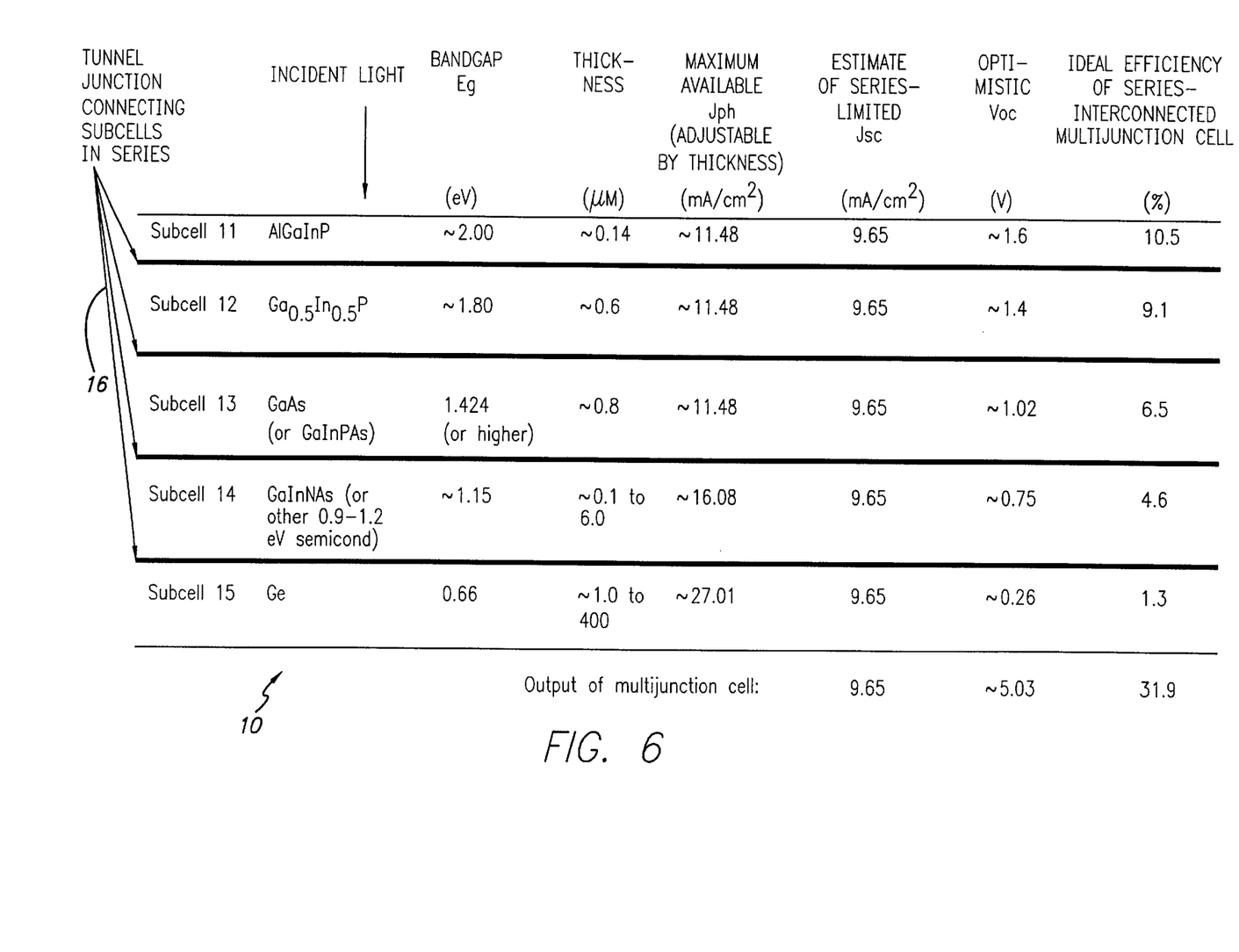
FIG. 6 is a schematic diagram of a sixth embodiment of the present invention.

FIG. 6 depicts a sixth embodiment of the present invention for another 5-junction cell 10, specifically, AlGaInP/GaInP/GaAs/GaInNAs/Ge. The AlGaInP first subcell 11 has a bandgap of 2.0 eV. The second GaInP subcell 12 has a bandgap of 1.80 eV, the third GaAs subcell 13 has a bandgap of 1.424 eV, the fourth subcell has a bandgap of ~0.9 to 1.2 eV, and the fifth subcell 15 has a bandgap of 0.66 eV. In this example, subcells 11, 12 are still considered to have similar compositions and similar bandgaps, much too close to allow current matching unless subcell 11 is made much thinner than subcell 12. However, with an AlGaInP subcell 11, the subcell 11 can be made slightly thicker than for a GaInP subcell 11, and the cell 10 efficiency is less sensitive to the exact thickness of the subcell 11.

As a variation of the above, if very thin absorbing regions and/or higher bandgaps are required in the fourth subcell 14 to achieve reasonable collection efficiencies, it may be especially advantageous to thin the third GaAs subcell 13 to allow more light to reach the fourth subcell 14. Although this suppresses the current of the multijunction cell 10, it may be a net improvement in efficiency if this allows the fourth subcell 14 to be current matched to the rest of the subcells. An example of this case is illustrated in FIG. 5 for which the fourth subcell 14 has a bandgap of 1.15 eV, and the third GaAs subcell 13 (as well as the first and second GaInP subcells 11, 12) have been thinned to give a maximum $J_{ph}$ of 11.48 mA/cm², which is about 1 mA/cm² lower than the 12.44 mA/cm² of the previous example. The calculated efficiency in this case is 31.2%. This is lower than in the previous example, with 33.0% efficiency, for which the third GaAs subcell 13 did not have to be thinned, but is still higher than a conventional 3-junction cell. For cases in which the fourth subcell 14 material is of poor electronic quality, thinning the GaAs base may result in a higher multijunction cell efficiency by allowing current matching among the subcells. Widening the bandgap of the third subcell 13 by using GaInPAs lattice-matched to GaAs, instead of a third GaAs subcell 13, provides another way to allow more light to pass through the third subcell 13 to reach the poor current producing fourth subcell 14. The use of wider bandgap GaInPAs in the third subcell 13 can also increase the cell voltage.

Figure 7:
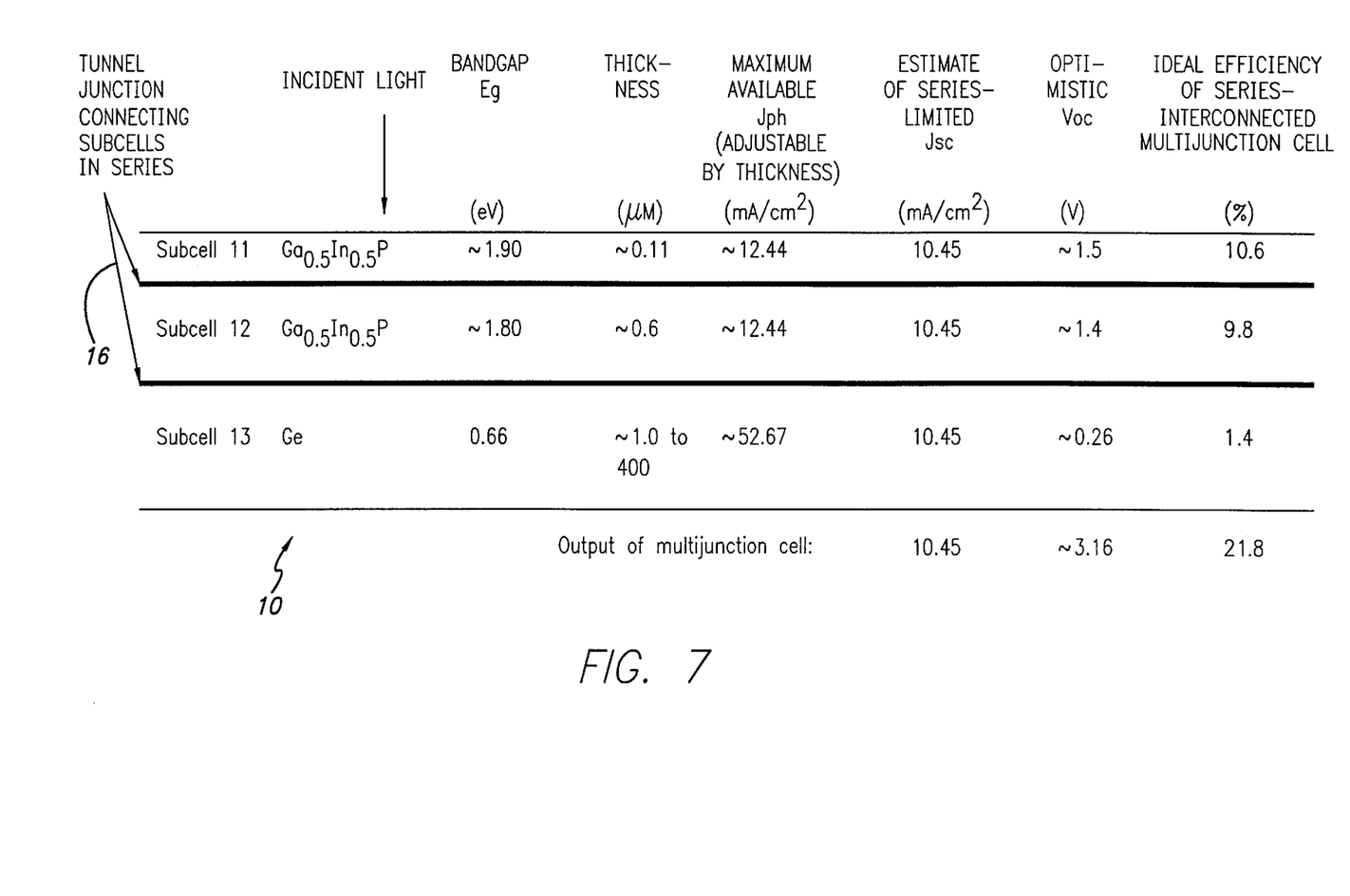
FIG. 7 is a schematic diagram of a seventh embodiment of the present invention.

In a seventh embodiment of the present invention, the thin GaInP subcell 11/thick GaInP subcell 12 is used in a structure similar to the 4-junction GaInP/GaInP/GaAs/Ge cell 10 shown in FIG. 4. However, the third GaAs subcell 13 is removed. The thicknesses of the subcells 11–13 are such that subcells 11, 12 have the same photogenerated current density (i.e., current matched condition), or nearly the same density, and the subcell 13 generates as much or more current than the other two subcells. This results in a 3-junction GaInP/GaInP/Ge cell 10 with a calculated efficiency of ~21.8%. Doing so removes the radiation degradation effect associated with the GaAs subcell, which is similar to the 2-junction GaInP/Ge cell described in the prior art.

However, the GaInP/GaInP/Ge 3-junction cell 10 has a thinner base in each GaInP subcell, particularly in the top subcell 11, and so may have greater radiation resistance in the GaInP subcells.

As can be appreciated by those skilled in the art, the present invention provides a multijunction photovoltaic cell with improved radiation resistance.

The photovoltaic cell of the invention combines the radiation resistance of GaInP with fairly narrow base thicknesses, which should reduce the susceptibility of minority carrier diffusion length to radiation degradation. The 2-junction GaInP/GaInP and 3-junction GaInP/GaInP/Ge cells of the present invention, on the other hand, have no third GaAs subcell to degrade. The 3-junction GaInP/GaInP/GaAs cell has substantial excess current in the GaAs subcell, thereby making it fairly insensitive to degradation in the GaAs. The 5-junction GaInP/GaAs/GaInNAs/Ge and AlGaInP/GaInP/GaAs/GaInNAs/Ge cells have a thin GaAs subcell, while both the 4-junction GaInP/GaInP/GaAs/Ge and the 5-junction GaInP/GaInP/GaAs/GaInNAs/Ge cell may have a thin GaAs subcell. Reducing the thickness of the GaAs subcell decreases its sensitivity to minority carrier diffusion length, resulting in greater radiation resistance. In addition, the third through sixth embodiments have excess current in the Ge subcell, also increasing the radiation resistance.

Figure 8:
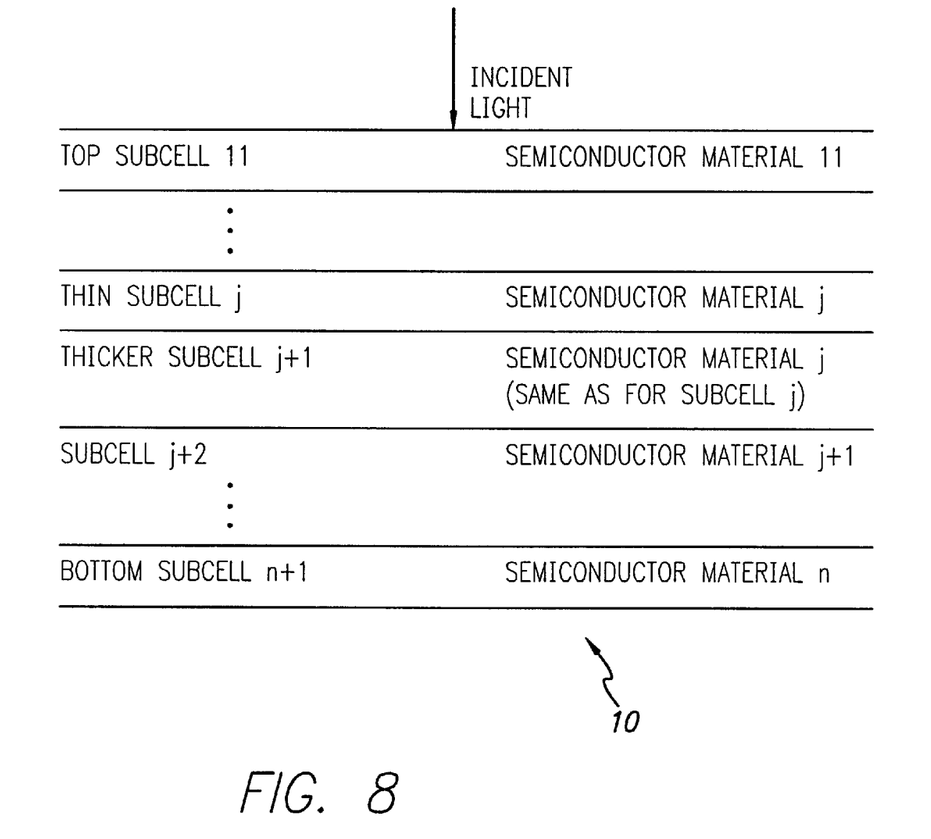
FIG. 8 is a schematic diagram of an eighth embodiment of the present invention.

In an eighth embodiment of the present invention (FIG. 8), the thin subcell/thick subcell pair made out of the same or similar semiconductor material may be used for not only subcells 11 and 12, but may also be used for subcells 12 and 13, or subcells 13 and 14, or in general, for subcells j and j+1 in a multijunction cell 10 that has a total number of subcells n greater than or equal to j+1. This is equivalent to replacing a given subcell j in a given multijunction cell 10 having n subcells, with a thin subcell j and a thicker subcell j+1 made of the same or similar semiconductor composition, resulting in a multijunction cell 10 with a total of n+1 subcells. Examples of this embodiment are GaInP/GaInP/GaAs 3-junction cells, and GaInP/GaAs/GaAs/Ge 4-junction cells where the GaAs subcell 12 is thinner that the GaAs subcell 13, in order that the photogenerated current density is approximately the same for each of the GaAs subcells, in spite of the subcells 12 and 13 being composed of GaAs. Other examples include GaInP/GaAs/Ge/Ge 4-junction cells, GaInP/GaAs/GaAs/GaInNAs/Ge 5-junction cells, GaInP/GaInAs/GaInAs/Ge 4-junction cells, and GaInP/GaInP/GaAs/GaAs/Ge 5-junction cells.

It should be understood, of course, that the foregoing relates to preferred embodiments of the invention and that modifications may be made without departing from the spirit and scope of the invention as set forth in the following claims.

What is claimed is:

1. A multijunction photovoltaic cell, comprising:
   a first subcell that initially receives incident light upon said cell, said first subcell being made of a first material system, having a first thickness, and producing a first photogenerated current output;
   a second subcell that receives said incident light after said first subcell receives said incident light, said second subcell being disposed immediately adjacent said first subcell, being made of said first material system, having a second thickness that is greater than said first thickness, and producing a second photogenerated current output that is substantially equal in amount to said first photogenerated current output;
   a tunnel junction disposed between said first and second subcells; and
   a bottom subcell that is disposed in said cell such that said bottom subcell is the last of said subcells to receive said incident light, said bottom subcell having a bottom photogenerated current output that is greater than said first photogenerated current output.

2. A multijunction photovoltaic cell, comprising:
   a top subcell made of a first material system, having a first thickness, having a first energy bandgap, and producing a first photogenerated current density;

a second subcell disposed immediately adjacent to said top subcell, said second subcell being made of a second material system, having a second thickness, producing a second photogenerated current density that is substantially equal in amount to said first photogenerated current density, and having a second energy bandgap that is less than said first energy bandgap such that a ratio of photon flux in incident light to said cell with photon energy greater than said first energy bandgap to photon flux in said incident light with photon energy between said first and second energy bandgaps is at least two;

a plurality of lower subcells adjacent said second subcell, said lower subcells made of a plurality of lower material systems that are different from said first and second material systems, each successively lower one of said lower subcells having an energy bandgap lower than the one immediately above it, and each successively lower one of said lower subcells having a photogenerated current density at least equal to the one immediately above it; and a plurality of tunnel junctions disposed between the subcells.

3. The cell of claim 2, wherein said second thickness is greater than said first thickness.

4. The cell of claim 2, wherein said first material system and second material system are the same.

5. The cell of claim 4, wherein said first and second material systems comprise GaInP.

6. The cell of claim 5, wherein said first energy bandgap is greater than said second energy bandgap due to the effect of group-III sublattice disorder in said top subcell that increases said first energy bandgap and also due to the effect of group-III sublattice ordering in said second subcell that decreases said second energy bandgap.

7. The cell of claim 2, wherein said first material system and second material system are different.

8. The cell of claim 7, wherein said first material system comprises AlGaInP and said second material system comprises GaInP.

9. The cell of claim 2, wherein said lower material systems comprise a material selected from the group consisting of GaAs, Ge, and GaInNAs.

10. The cell of claim 2, wherein said lower material systems comprise a material selected from the group consisting of GaAs, GaInNAs, and GaInPAs.

11. A multijunction photovoltaic cell, comprising:

a first subcell made of a first semiconductor composition having a first thickness, and producing a first photogenerated current output; wherein said first subcell is disposed in said multijunction cell such that said first subcell is the first of said subcells to receive light incident upon said multijunction cell;

a second subcell that is disposed immediately adjacent said first subcell, said second subcell being made of said first semiconductor composition having a second thickness, wherein said first thickness is less than said second thickness, and producing a second photogenerated current output that is substantially equal in amount to said first photogenerated current output, wherein said first subcell is characterized by a first energy bandgap and said second subcell is characterized by a second energy bandgap that is lower than said first energy bandgap; and a tunnel junction disposed between said first and second subcells.

12. The cell of claim 11, wherein said first subcell is characterized by a first energy bandgap and said second subcell is characterized by a second energy bandgap that is lower than said first energy bandgap, by ordering of the atoms from group-III of the periodic table, that occupy the sublattice of the semiconductor for atoms of group-III.

13. The cell of claim 11, wherein said first subcell has a base composed of a first composition of GaInP with at least partially or disordered Ga and In atoms on the column-III sublattice of the GaInP resulting in a bandgap of approximately 1.8 eV to 2.0 eV, and said second subcell is composed of a second composition of GaInP that is stoichiometrically identical to said first composition, but with at least partially ordered Ga and In atoms on the column-III sublattice of the GaInP resulting in a bandgap that is approximately 0.05 eV to 0.15 eV less than that of said first subcell.

14. A multijunction photovoltaic cell, comprising:

a first subcell made of a first semiconductor composition having a first thickness, and producing a first photogenerated output;

a second subcell that is disposed immediately adjacent said first subcell, said second subcell being made of said first semiconductor composition having a second thickness, and producing a second photogenerated current output that is substantially equal in amount to said first photogenerated output;

at least one additional subcell that is of different semiconductor composition and is characterized by a different bandgap than for said first subcell and said second subcell; and a tunnel junction disposed between each adjacent pair of the subcells.

15. The cell of claim 14, wherein said first subcell is characterized by a first energy bandgap and said second subcell is characterized by a second energy bandgap that is lower than said first energy bandgap.

16. The cell of claim 14, wherein said first subcell is characterized by a first energy bandgap and said second subcell is characterized by a second energy bandgap that is lower than said first energy bandgap, by ordering of the atoms from group-III of the periodic table, that occupy the sublattice of the semiconductor for atoms of group-III.

17. The cell of claim 14, wherein said first subcell has a base composed of a first composition of GaInP with at least partially disordered Ga and In atoms on the column-III sublattice of the GaInP resulting in a bandgap of approximately 1.8 eV to 2.0 eV, and said second subcell is composed of a second composition of GaInP that is stoichiometrically identical to said first composition, but with at least partially ordered Ga and In atoms on the column-III sublattice of the GaInP resulting in a bandgap that is approximately 0.05 eV to 0.15 eV less than that of said first subcell.

18. The cell of claim 14, wherein said first subcell is characterized by a first energy bandgap and said second subcell is characterized by a second energy bandgap that is equal in value to said first energy bandgap, and wherein said multijunction cell comprises a plurality of additional subcells with different composition and different bandgap than said first and second subcells.

19. The cell of claim 14, wherein the subcells are disposed in said multijunction cell such that light incident on the multijunction cell is received first by said first subcell, then by said second subcell, and then by said at least one additional subcell.

20. The cell of claim 14, in which said multijunction cell consists of a combination of subcell base compositions selected from the group consisting of:

a 5-junction GaInP/GaInP/GaAs/GaInNAs/Ge cell;

a 5-junction GaInP/GaInP/GaAs/GaInNAs/Ge cell with thin GaAs base in the range of about 0.5 to 0.8 microns thickness; and a 5-junction GaInP/GaInP/GaInPAs/GaInNAs/Ge cell.

21. The cell of claim 14, in which said multijunction cell consists of a combination of subcell base compositions selected from the group consisting of:

a 3-junction GaInP/GaInP/GaAs cell;

a 3-junction GaInP/GaInP/GaInAs cell;

a 3-junction GaInP/GaInP/GaInPAs cell;

a 3-junction GaInP/GaAs/GaAs cell;

a 3-junction GaInP/GaInAs/GaInAs cell;

a 4-junction GaInP/GaInP/GaAs/Ge cell;

a 4-junction GaInP/GaAs/GaAs/Ge cell;

a 4-junction GaInP/GaAs/Ge/Ge cell;

a 5-junction GaInP/GaAs/GaAs/GaInNAs/Ge cell;

a 4-junction GaInP/GaInAs/GaInAs/Ge cell; and a 5-junction GaInP/GaInP/GaAs/GaAs/Ge cell.

22. The cell of claim 14, wherein said first thickness is less than said second thickness.

23. The cell of claim 14, in which said at least one additional subcell in said multijunction cell has excess photogenerated current density compared to the other subcells in said multijunction cell and in which the subcell having excess photogenerated current density is a Ge subcell which also serves as the substrate.

* * * * *